US011500291B2

(12) United States Patent
Lee et al.

(10) Patent No.: US 11,500,291 B2
(45) Date of Patent: Nov. 15, 2022

(54) UNDERLYING COATING COMPOSITIONS FOR USE WITH PHOTORESISTS

(71) Applicant: Rohm and Haas Electronic Materials Korea Ltd., Chungcheongnam-Do (KR)

(72) Inventors: Jung-June Lee, Gyeonggi-do (KR); Jae-Yun Ahn, Gyeonggi-do (KR); You-Rim Shin, Gyeonggi-do (KR); Jin-Hong Park, Gyeonggi-do (KR); Jae-Hwan Sim, Seongnam-Gyeonggi-do (KR)

(73) Assignee: ROHM AND HAAS ELECTRONIC MATERIALS KOREA LTD., Chungcheongnam-Do (KR)

( * ) Notice: Subject to any disclaimer, the term of this patent is extended or adjusted under 35 U.S.C. 154(b) by 105 days.

(21) Appl. No.: 15/800,002

(22) Filed: Oct. 31, 2017

(65) Prior Publication Data
US 2019/0129305 A1    May 2, 2019

(51) Int. Cl.
| | |
|---|---|
| *G03F 7/09* | (2006.01) |
| *G03F 7/16* | (2006.01) |
| *G03F 7/20* | (2006.01) |
| *G03F 7/26* | (2006.01) |
| *G03F 7/039* | (2006.01) |
| *C09D 5/00* | (2006.01) |
| *C08G 73/06* | (2006.01) |
| *C09D 179/04* | (2006.01) |

(52) U.S. Cl.
CPC ......... *G03F 7/091* (2013.01); *C08G 73/0655* (2013.01); *C09D 5/006* (2013.01); *C09D 179/04* (2013.01); *G03F 7/0392* (2013.01); *G03F 7/094* (2013.01); *G03F 7/162* (2013.01); *G03F 7/168* (2013.01); *G03F 7/2004* (2013.01); *G03F 7/26* (2013.01)

(58) Field of Classification Search
CPC ............................ G03F 7/091; C08G 73/0655
See application file for complete search history.

(56) References Cited

U.S. PATENT DOCUMENTS

| | | | | |
|---|---|---|---|---|
| 3,230,220 | A | * | 1/1966 | Osborn .............. C08G 63/6854 544/221 |
| 4,053,538 | A | * | 10/1977 | Herweh ............... C07D 251/34 525/444 |
| 5,128,232 | A | | 7/1992 | Thackeray et al. |
| 6,261,743 | B1 | | 7/2001 | Pavelchek et al. |
| 6,767,689 | B2 | | 7/2004 | Pavelchek et al. |
| 6,887,648 | B2 | | 5/2005 | Pavelchek et al. |
| 7,183,037 | B2 | | 2/2007 | Mao et al. |
| 7,968,268 | B2 | | 6/2011 | Wang |
| 8,501,383 | B2 | | 8/2013 | Zampini et al. |
| 8,507,192 | B2 | | 8/2013 | Yao et al. |
| 8,623,589 | B2 | | 1/2014 | Kudo et al. |
| 9,541,834 | B2 | | 1/2017 | Pohlers et al. |
| 2006/0226122 | A1 | | 10/2006 | Wojtczak et al. |
| 2006/0290429 | A1 | * | 12/2006 | Kishioka ................ G03F 7/038 430/270.1 |
| 2011/0033800 | A1 | | 2/2011 | Zampini et al. |
| 2011/0200938 | A1 | | 8/2011 | Yao et al. |
| 2011/0294069 | A1 | | 12/2011 | Bae et al. |
| 2015/0212414 | A1 | | 7/2015 | Pohlers et al. |
| 2017/0283651 | A1 | | 10/2017 | Sim et al. |

FOREIGN PATENT DOCUMENTS

| | | |
|---|---|---|
| CN | 1723418 A | 1/2006 |
| EP | 0164248 A2 | 12/1985 |

OTHER PUBLICATIONS

Kauffman, W.J. "Linear Polyesters Containing Isocyanurate Rings", Journal of Polymer Science: Polymer Chemistry Edition, vol. 12, pp. 1735-1743 year 1974 . (Year: 1974).*

* cited by examiner

*Primary Examiner* — Duane Smith
*Assistant Examiner* — Nicholas E Brown
(74) *Attorney, Agent, or Firm* — Cantor Colburn LLP

(57) ABSTRACT

New composition and methods are provided that include antireflective compositions that can exhibit enhanced etch rates in standard plasma etchants. Preferred antireflective coating compositions of the invention have decreased carbon content relative to prior compositions.

19 Claims, No Drawings

UNDERLYING COATING COMPOSITIONS FOR USE WITH PHOTORESISTS

1. FIELD

The present invention relates to new compositions and methods that include antireflective compositions that can exhibit enhanced etch rates in standard plasma etchants. Preferred antireflective coating compositions of the invention have decreased carbon content relative to prior compositions.

2. INTRODUCTION

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating.

Known photoresists can provide features having resolution and dimension sufficient for many existing commercial applications. However for many other applications, the need exists for new photoresists and related materials and processes that can provide highly resolved images of submicron dimension.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. Such layers have also been referred to as antireflective layers or antireflective compositions. See U.S. Pat. No. 9,541,834; US20150212414; U.S. Pat. No. 6,767,689B2; US6887648B2; and U.S. Pat. No. 8,623,589. See also U.S. Pat. Nos. 8,501,383; 8,507,192; and 7,183,037.

While it has been found that prior underlying antireflective coating compositions may be effective for many antireflective applications, those prior compositions also may pose some potential performance limitations.

In particular, underlying antireflective coating compositions etch rates can be problematic. During plasma etching of an underlying antireflective coating composition layer to thereby bare a substrate (e.g. microelectronic wafer) surface, the plasma etch also will remove the overlying developed photoresist mask. An effective thickness of the resist mask must remain after the ARC is complete to function during processing of the bared substrate surface. However, as the time period required to remove the ARC layer increases, the extent of degradation of photoresist mask also increases. This is highly undesirable.

Photoresist degradation should be minimized to permit application of a thin a photoresist layer as possible. Thinner resist layers are often desired to provide maximum resolution of a patterned image. If undesired film thickness loss (UFTL) is significant during underlying antireflective coating composition etching, then a thicker resist layer must be applied so that a resist mask of an effective thickness remains at the end of the etching process.

It thus would be desirable to have new antireflective coating compositions for use with an overcoated photoresist layer. It would be particularly desirable to have new antireflective coating compositions that would minimize photoresist degradation by means of a faster etch rate.

SUMMARY

We have now discovered new methods, coated substrates and antireflective coating compositions particularly suitable for use as a 193 nm organic bottom anti-reflective coating (BARC). Photoresists are applied over coating layers of the present antireflective coating compositions.

Particularly preferred underlying coating compositions can exhibit enhanced etch rates in plasma etchants such as an $F_2/O_2$ plasma etchant.

In preferred aspects, provided are underlying coating composition comprising a resin comprising repeat units that comprise a structure of following Formula (I):

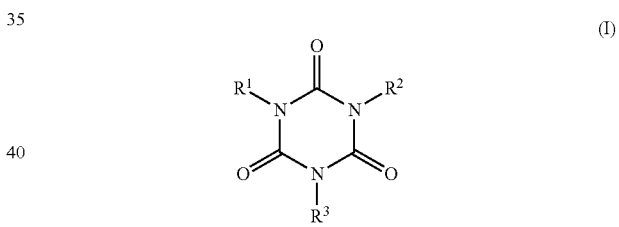

wherein $R^1$, $R^2$ and $R^3$ are each independently hydrogen or a non-hydrogen substituent, with at least one of $R^1$, $R^2$ and $R^3$ being —(CXY)(C=O)O—R where R is linkage to another polymer unit and X and Y are each independently hydrogen or non-hydrogen substituent such as halogen or optionally substituted alkyl or optionally substituted alkoxy; and b) applying a layer of a photoresist composition above the coating composition layer. Often preferred is where one or both of X and Y are hydrogen, i.e. where at least one of $R^1$, $R^2$ and $R^3$ is —$CH_2$(C=O)O—R.

In one preferred aspect, in Formula (I), each of $R^1$, $R^2$ and $R^3$ are other than hydrogen. In a particularly preferred aspect, at least two of $R^1$, $R^2$ and $R^3$ are —(CXY)(C=O)O—R where R is linkage to another polymer unit and X and Y are each independently hydrogen or non-hydrogen substituent such as halogen or optionally substituted alkyl or optionally substituted alkoxy. Preferably, at least one of $R^1$, $R^2$ and $R^3$ is 1) other than —(CXY)(C=O)O—R and 2) comprises one or more oxygen atoms.

In preferred aspects, preferred resins may comprise a polymerized group obtainable from reaction of a monomer of the following Formula (II):

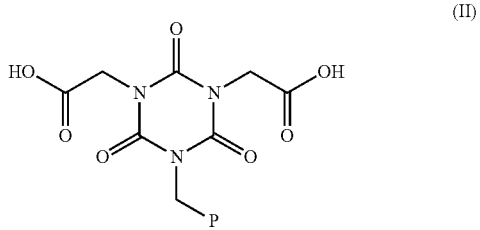

wherein in Formula (II) P is hydrogen or a non-hydrogen substituent and suitably may be for example optionally substituted alkoxy, optionally substituted alkyl or optionally substituted carboxy (e.g. —(C═O)OH).

The resin may further include covalently crosslinker units, i.e. resin units that react such as upon thermal heating of an applied coating layer (e.g. 150° C. for 60 seconds) to form covalent bonds between resins or otherwise harden the applied composition layer.

The resin may suitably have an Ohnishi parameter number of 7 or greater, such 7.2, 7.3, 7.4, 7.5, 7.6, 7.7, 7.8, 7.9, 8.0 or 8.45 or greater. As referred to herein, an Ohnishi parameter number is calculated as the value of the total number of atoms of a resin (not including hydrogens) divided by the total number of carbon atoms of the resin less then total number of oxygen and nitrogen atoms of the resin.

In certain aspects, the underlying coating composition suitably may comprise a crosslinker component that is distinct from the resin.

Preferably, the overcoated photoresist composition may be imaged with activating radiation and the imaged photoresist composition layer is developed to provide a photoresist relief image. As discussed, the coating composition layer may suitably be thermally treated before applying the photoresist composition layer.

Further provided herein is a coated substrate comprising: a substrate having thereon: a) a coating composition comprising: 1) a resin comprising repeat units that comprise a structure of following Formula (I):

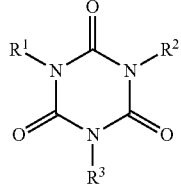

wherein $R^1$, $R^2$ and $R^3$ are each independently hydrogen or a non-hydrogen substituent, with at least one of $R^1$, $R^2$ and $R^3$ being —(CXY)(C═O)O—R where R is linkage to another polymer unit and X and Y are each independently hydrogen or non-hydrogen substituent such as halogen or optionally substituted alkyl or optionally substituted alkoxy; and b) a layer of a photoresist composition above the coating composition layer.

Also provided herein are methods for forming a photoresist relief image comprising a) applying on a substrate such as a semiconductor substrate an underlying coating composition and b) applying thereover a photoresist composition layer.

Other aspects of the invention are disclosed infra.

DETAILED DESCRIPTION

In preferred aspect, provided herein are methods of forming a photoresist relief image. In one aspect, the method may include applying on a substrate a layer of a coating composition and applying a layer of a photoresist composition above the coating composition layer. In another preferred aspect, provided herein are coated substrates including a substrate, the coating composition and a layer of the photoresist composition above the coating composition layer. In further preferred aspect, provided herein are antireflective coating compositions including the resin for use with an overcoating photoresist composition.

Coating Composition Layer

In one preferred aspect, the coating composition or the coating composition layer may form a 193 nm organic bottom anti-reflective coating (BARC) that is known to be one of the important underlayers for reflectivity control and interface adhesion enhancement between photoresist film and substrates in the lithography technology. Recently, as reduced critical dimension of photoresist (PR) for microscale patterning, PR thickness was decreased for improving a physical pattern collapse issued by worse PR aspect ratio and accordingly, organic BARC as hard mask is required faster etch rate (E/R) performance to improving etch selectivity with reduced PR thickness and minimizing a etch bias by slow E/R.

In one aspect, the coating composition may include a resin comprising repeat units that comprise a structure of following Formula (I):

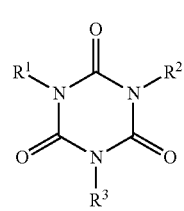

wherein $R^1$, $R^2$ and $R^3$ are each independently hydrogen or a non-hydrogen substituent, with at least one of $R^1$, $R^2$ and $R^3$ being —CH$_2$C(═O)O—R where R is linkage to another resin unit; and applying a layer of a photoresist composition above the coating composition layer.

In certain preferred aspect, each of $R^1$, $R^2$ and $R^3$ are other than hydrogen. In one preferred aspect, at least two of $R^1$, $R^2$ and $R^3$ are —CH$_2$(C═O)O—R where R is linkage to another polymer unit. In one preferred aspect, at least one of $R^1$, $R^2$ and $R^3$ is 1) other than —CH$_2$(C═O)O—R; and 2) comprises one or more oxygen atoms.

Preferably, the polymer may provide a decreased reflectivity in 193 nm immersion lithography.

As discussed above, preferred resins may comprise a polymerized group obtainable from reaction of a monomer of the following Formula (II):

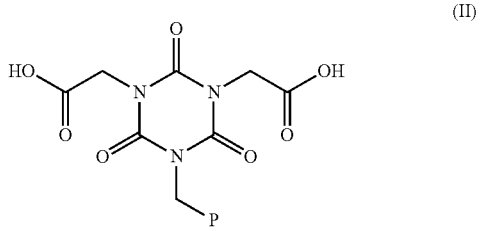

(II)

wherein in Formula (II) P is hydrogen or a non-hydrogen substituent and suitably may be for example optionally substituted alkoxy, optionally substituted alkyl or optionally substituted carboxy (e.g. —(C=O)OH).

In an exemplary embodiment, a preferred resin of an underlying coating composition may comprise a structure as shown within the brackets of the following Formula (III).

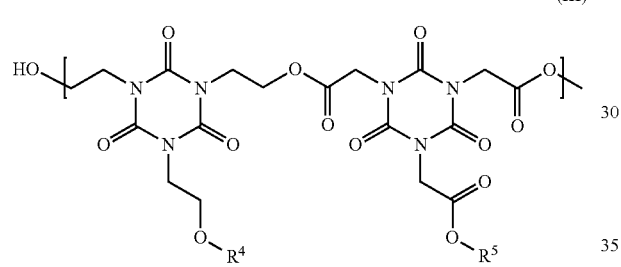

(III)

wherein Formula (III) $R^4$ is a group that can crosslink or form covalent bonds between resins particularly upon thermal treatment (such as 150° C. for 60 seconds); and $R^5$ is suitably a hydrogen or non-hydrogen substituent such as optionally substituted alkyl, optionally substituted alkoxy, or optionally substituted carbocyclic alkyl with one, two or three hydroxyl groups being preferred substituents of such alkyl, alkoxy or carbocyclic aryl. Preferred $R^4$ groups include nitrogen-containing moieties such as a glycoruril.

In the above Formulae (I), (II) and (III), suitable non-hydrogen substituents, may be e.g. optionally substituted C1-20alkyl, optionally substituted C1-20alkoxy, such as optionally substituted alkyl (e.g. optionally substituted C1-10alkyl), optionally substituted alkenyl or alkynyl preferably having 2 to about 20 carbon atoms such as such as allyl; optionally substituted ketones preferably having 1 to about 20 carbon atoms; optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; optionally substituted carboxy preferably have 1 to about 20 carbon atoms (which includes groups such as —COOR' where R' is or C1-8alkyl, including esters that are substantially non-reactive with photoacid); and the like.

As also discussed herein including with respect to the above Formulae (I), (II) and (III), various substituents suitably may be an optionally substituted. A "substituted" substituent may be substituted at one or more available positions, typically 1, 2, or 3 positions by one or more suitable groups such as e.g. halogen (particularly F, Cl or Br); cyano; nitro; $C_{1-8}$alkyl; $C_{1-8}$alkoxy; $C_{1-8}$alkylthio; $C_{1-8}$alkylsulfonyl; $C_{2-8}$alkenyl; $C_{2-8}$alkynyl; hydroxyl; nitro; alkanoyl such as a $C_{1-6}$alkanoyl e.g. acyl, haloalkyl particularly $C_{1-8}$haloalkyl such as $CF_3$; —CONHR, —CONRR' where R and R' are optionally substituted $C_{1-8}$alkyl; —COOH, COC, >C=O; and the like.

In preferred embodiments, resins of the present underlying coating compositions may include one or more repeat units that include a structure depicted within the brackets of any of the following formulae (A) through (R):

(A)

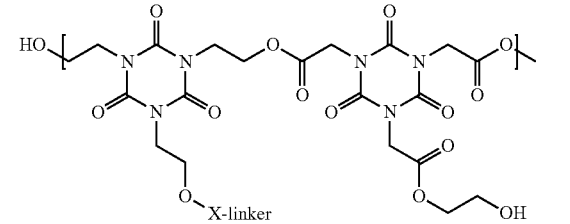

(B)

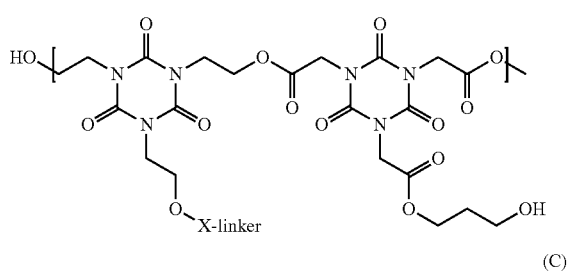

(C)

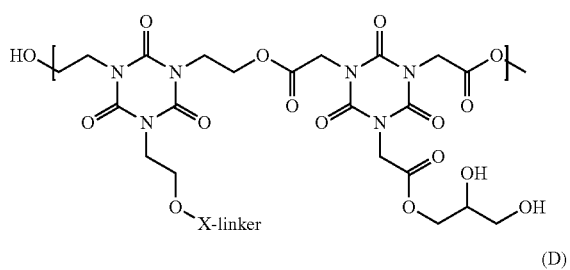

(D)

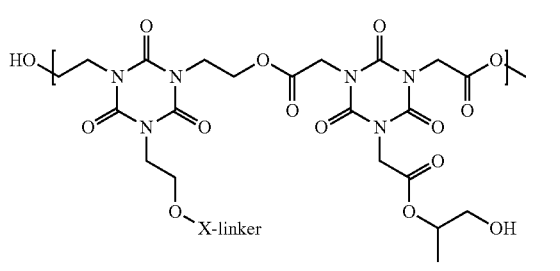

(E)

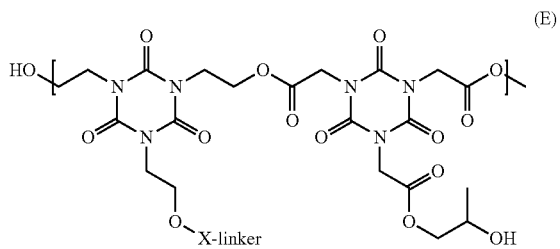

(F)
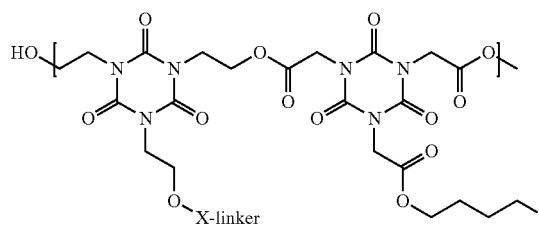
(G)
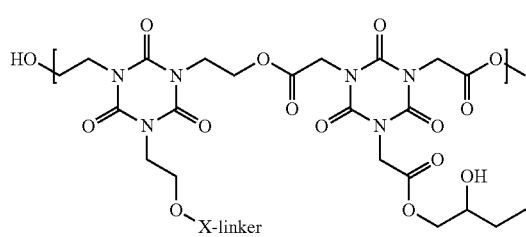
(H)
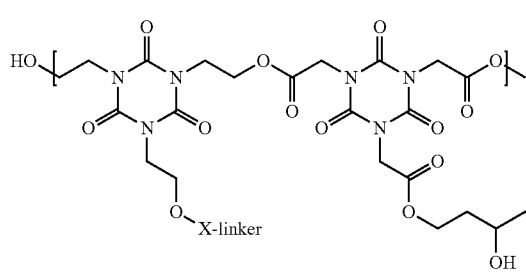
(I)
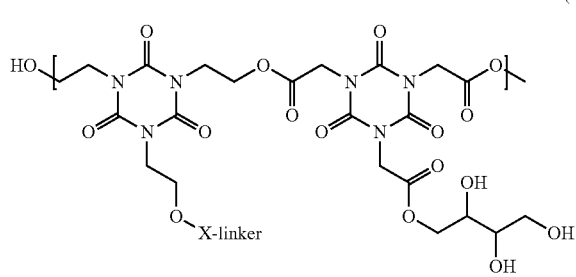
(J)
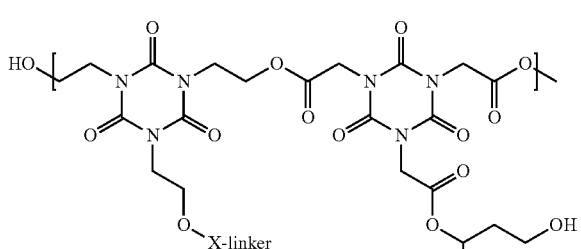
(K)
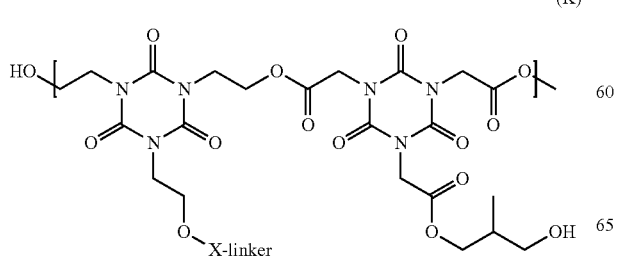
(L)
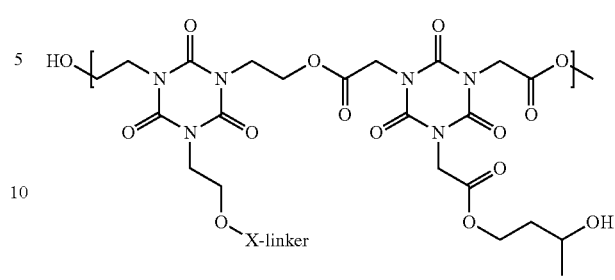
(M)
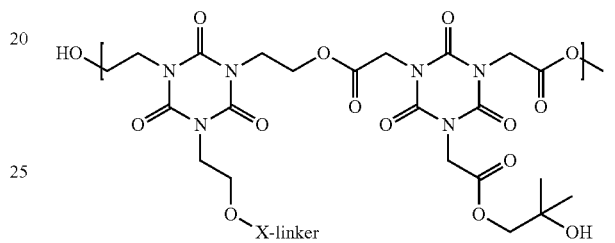
(N)
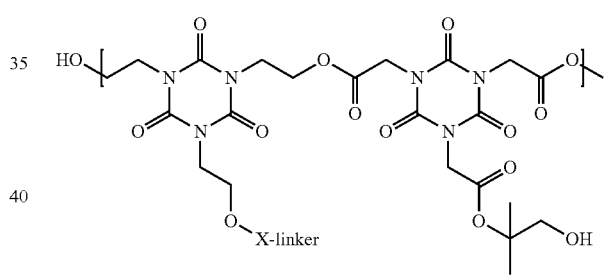
(O)
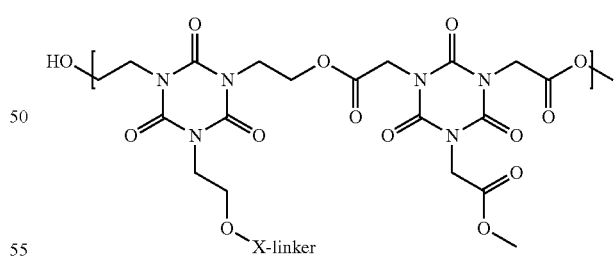
(P)
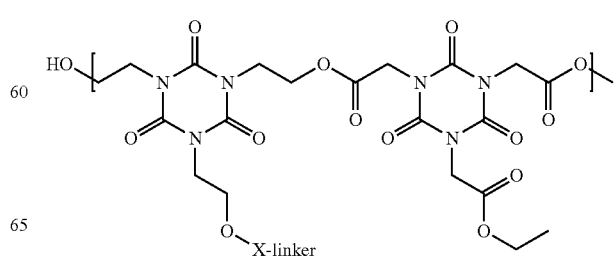

(Q)

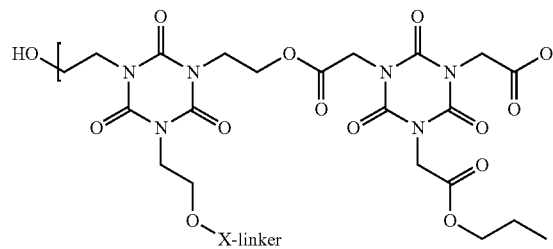

(R)

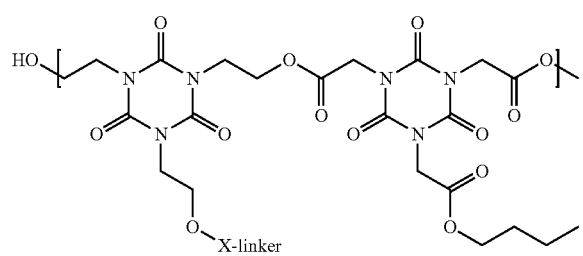

where in those above structures (A) through (R) "X-linker" designates a non-hydrogen substituent such as optionally substituted C1-20alkyl or optionally substituted C1-20alkoxy and preferably may be moiety that can react with other resin units during thermal treatment (e.g. 170° C. for 60 seconds). A preferred "X-linker" moiety in the above structures (A) through (R) may include nitrogen-containing groups such as a glycouril and the like.

In particular embodiments, resins of the present underlying coating compositions may include one or more repeat units that include a structure depicted within the brackets of any of the following formulae (P-A) through (P-R):

(P-A)

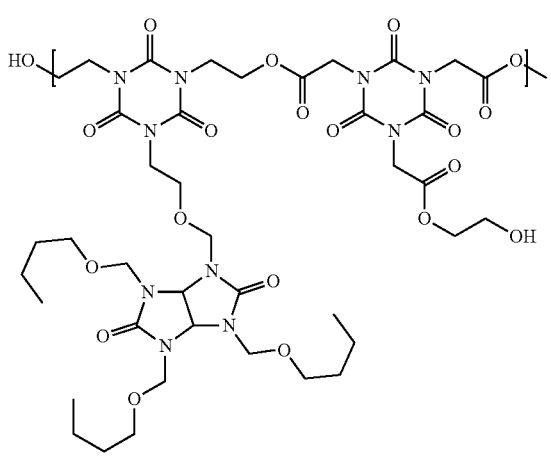

(P-B)

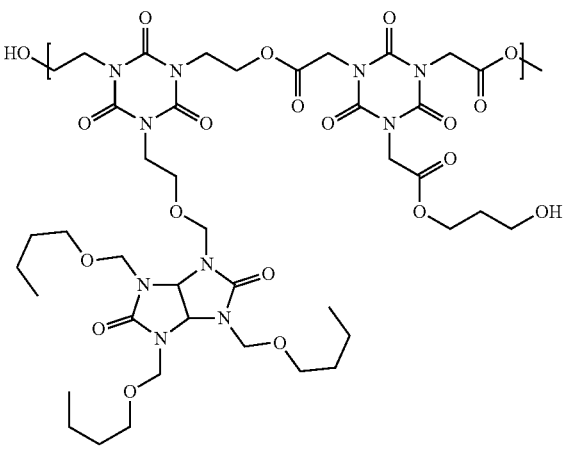

(P-C)

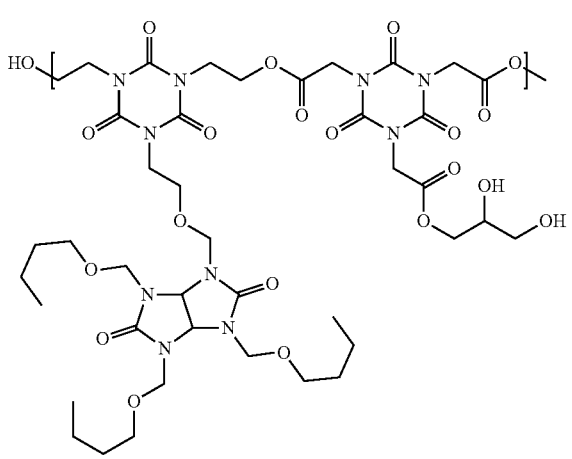

(P-D)

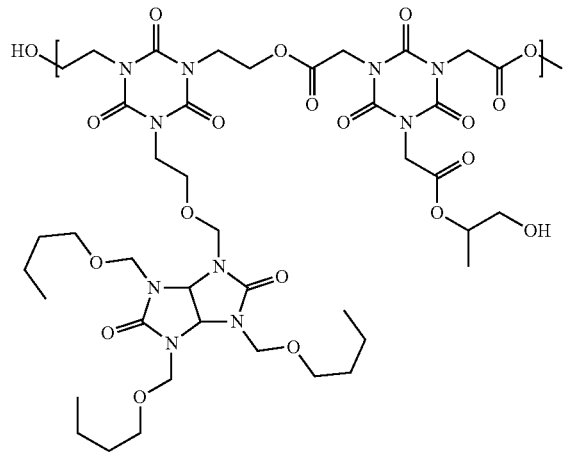

(P-E)
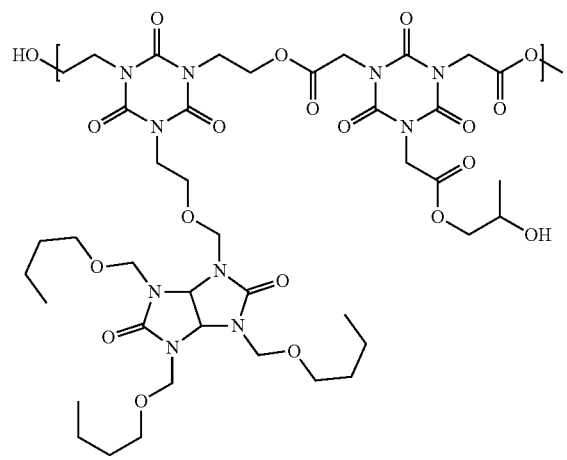
(P-H)
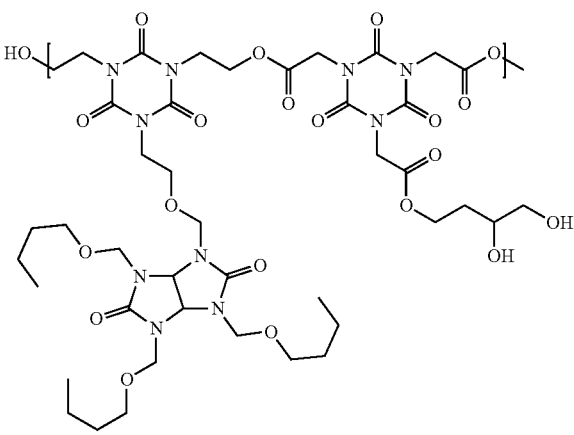
(P-F)
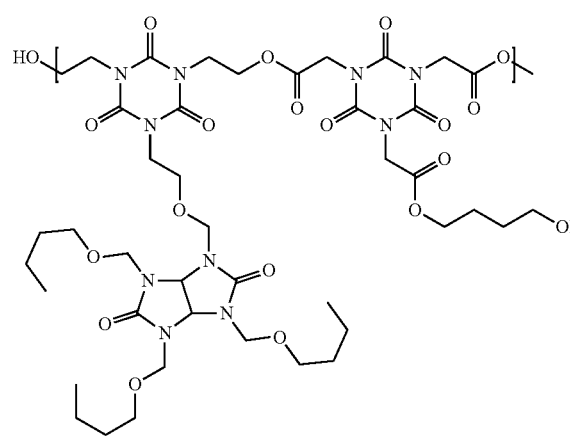
(P-I)
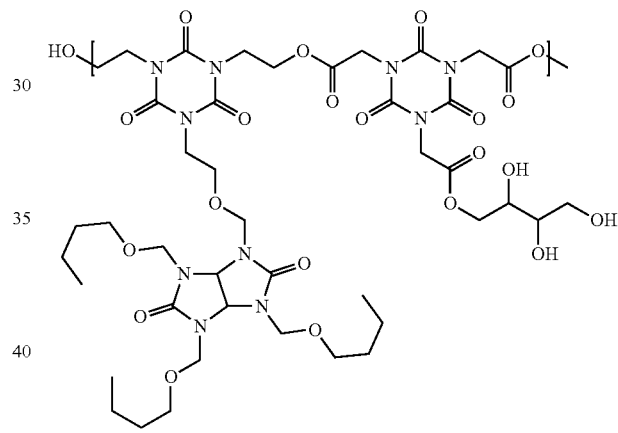
(P-G)
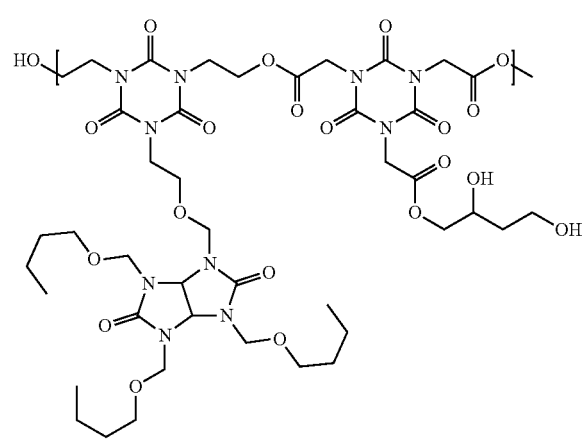
(P-J)
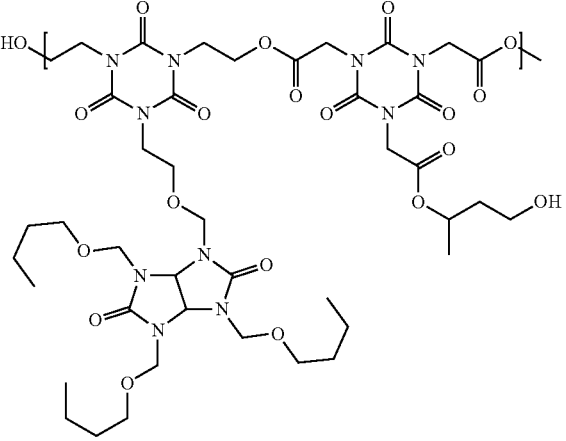

(P-K)
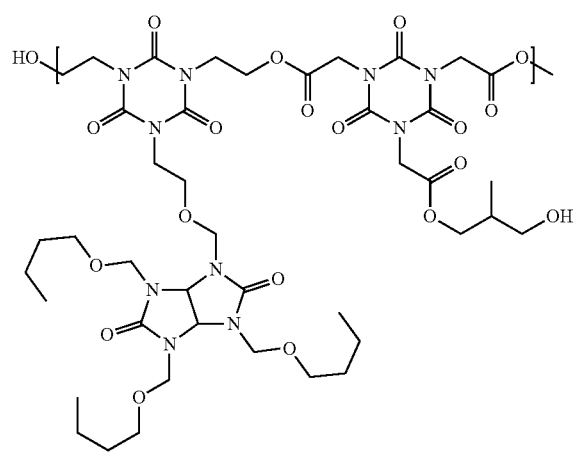
(P-N)
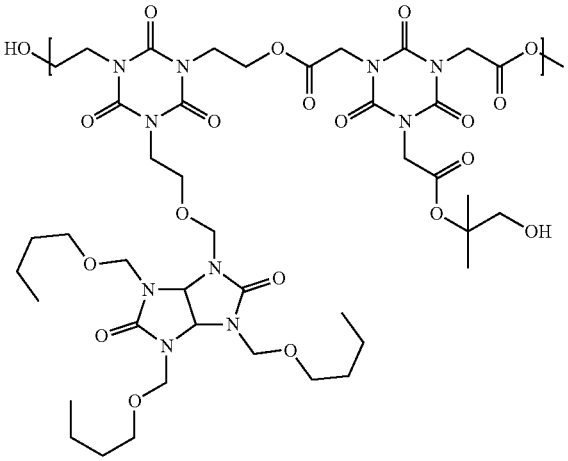
(P-L)
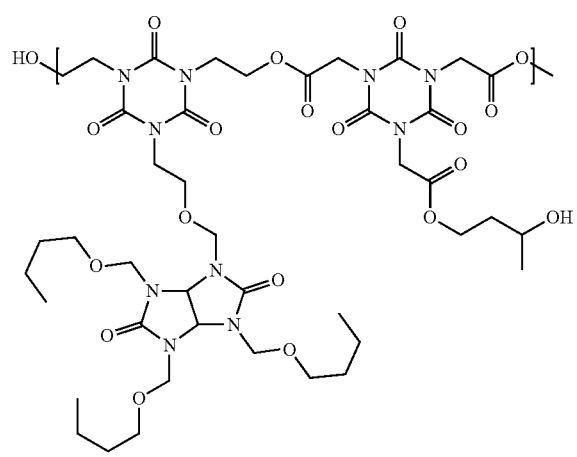
(P-O)
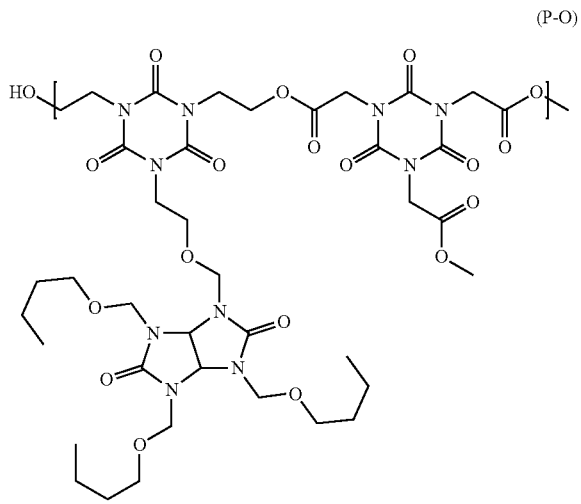
(P-M)
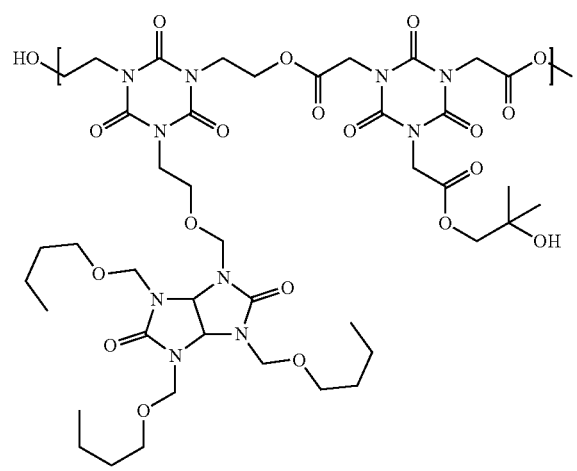
(P-P)
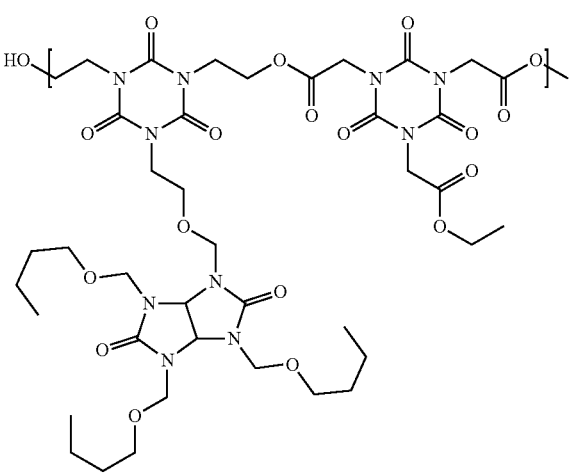

(P-Q)

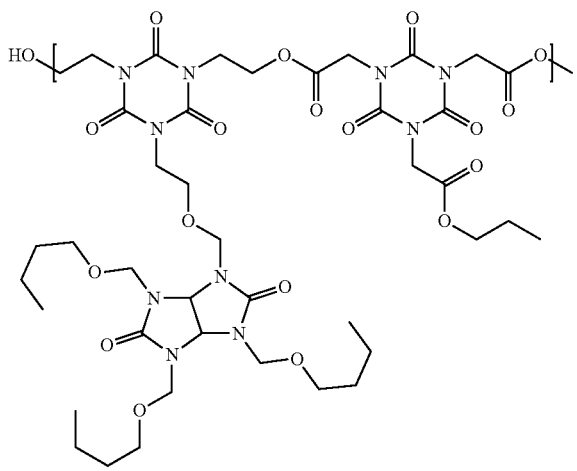

(P-R)

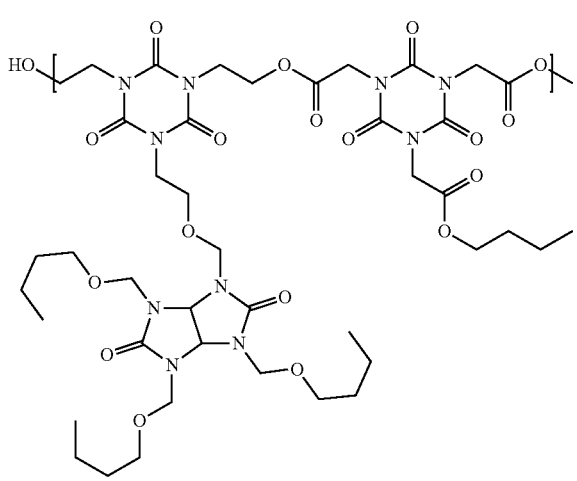

In preferred embodiments, the resin including the repeat units as described herein may provide increased etch rate (E/R) of an underlying coating composition comprising the resin.

Particularly preferred resins of the present underlying coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

As discussed, preferred resins of the present underlying coating compositions may comprise cyanuarate (including isocyanurate) units. Resins that comprise polyester linkages and cyanurate units are particularly preferred.

Preferably resins of underlying coating compositions of the invention will have a weight average molecular weight (Mw) of about 1,000 to about 10,000,000 daltons, more typically about 2,000 to about 10,000 daltons, and a number average molecular weight (Mn) of about 500 to about 1,000,000 daltons. Molecular weights (either Mw or Mn) of the resins of compositions of the invention are suitably determined by gel permeation chromatography.

The resin component will be the major solids component of an underlying coating composition in many preferred embodiments. For instance, one or resins suitably may be present from 50 to 99.9 weight percent based on total solid content of a coating composition, more typically from 80 or 85 to 95, 98 or 99+ (or even 100) weight percent based total solid content of a coating composition. As referred to herein, solids of a coating composition refer to all materials of the coating composition except solvent carrier.

Suitable and preferred resins for use in the present underlying antireflective compositions can be readily prepared. See, for instance, Example 1, which follows and details reaction of an isocyanurate reagent to provide a polyester cyanurate resin.

As discussed above, in certain embodiments, a coating composition of the invention may comprise a crosslinker in addition to or as a component of a resin. For example, coating compositions may include amine-based crosslinkers such as melamine materials, including melamine resins such as manufactured by Cytec industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid underlying coating composition, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Photoresists

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic groups) such as optionally phenyl, e.g. a styrene or vinyl phenol monomer.

Preferred monomers used for the formation of such polymers include: an acid-labile monomer having the following formula (IV), a lactone-containing monomer (V) and polarity control monomer of the following formula (VI), or a combination comprising at least one of the foregoing monomers:

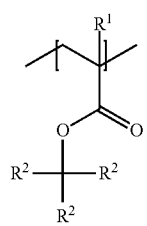
(IV)

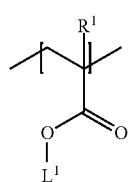
(V)

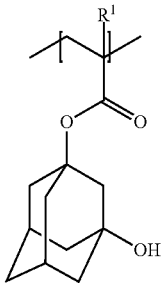
(VI)

wherein each $R^1$ is independently H, F, —CN, $C_{1-6}$ alkyl, or $C_{1-6}$ fluoroalkyl. In the acid-deprotectable monomer of formula (IV), $R^2$ is independently $C_{1-20}$ alkyl, $C_{3-20}$ cycloalkyl, or $C_{6-20}$ aryl, and each $R^2$ is separate or at least one $R^2$ is bonded to an adjacent $R^2$ to form a cyclic structure. In lactone-containing monomer of formula (V), $L^1$ is a monocyclic, polycyclic, or fused polycyclic $C_{4-20}$ lactone-containing group.

The unit of general formula (IV) includes an acid labile group that undergoes a photoacid-promoted deprotection reaction on exposure to activating radiation and heat treatment. This allows for a switch in polarity of the matrix polymer, leading to a change in solubility of the polymer and photoresist composition in an organic developer. Suitable monomers for forming units of formula (IV) include, for example, the following:

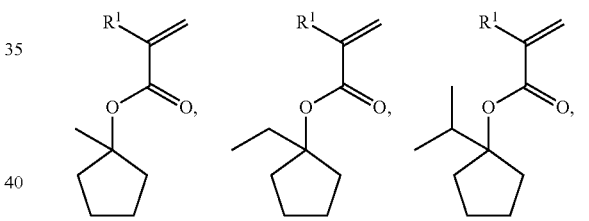

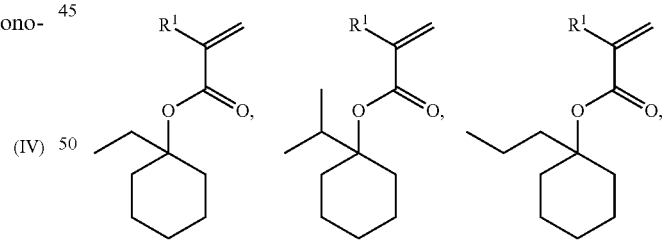

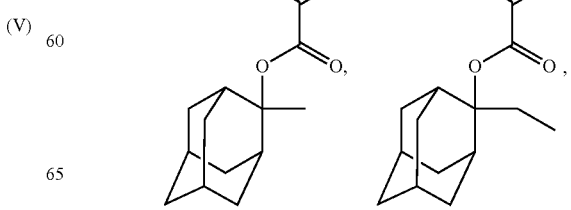

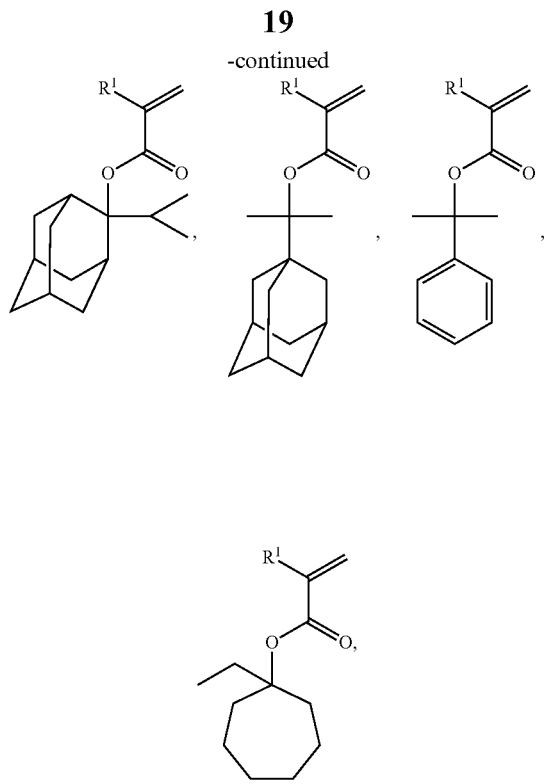

or a combination comprising at least one of the foregoing monomers, wherein $R^1$ is H, F, —CN, $C_{1-6}$ alkyl, or $C_{1-6}$ fluoroalkyl.

The unit of general formula (V) includes a lactone moiety effective to control the dissolution rate of the matrix polymer and photoresist composition. Suitable monomers for forming units of general formula (V) include, for example, the following:

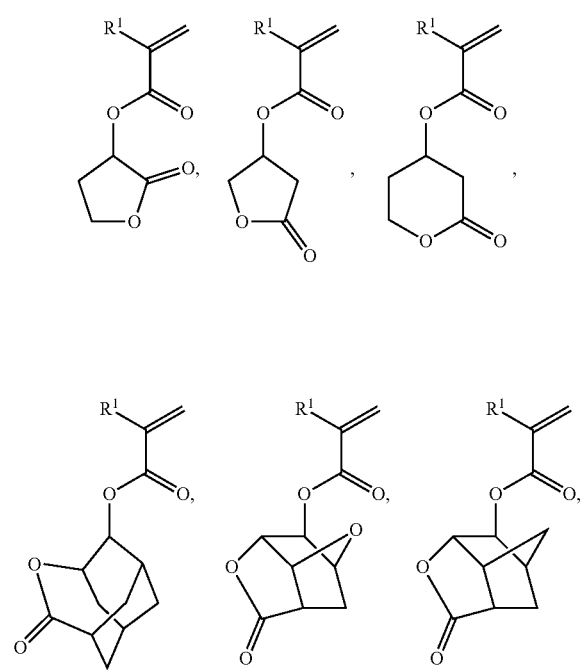

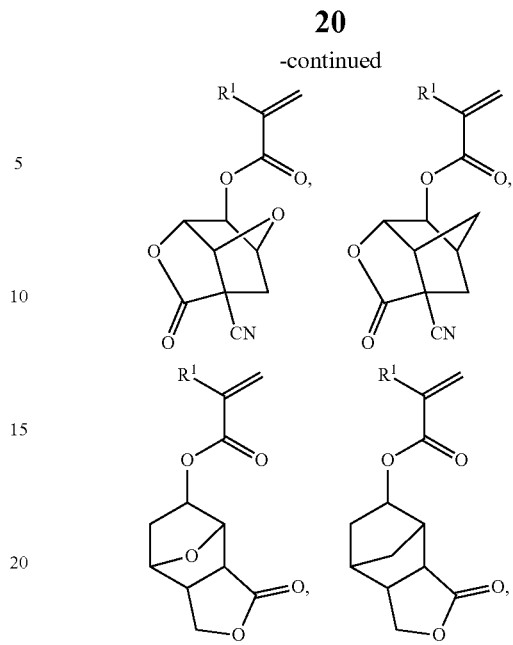

or a combination comprising at least one of the foregoing monomers, wherein $R^1$ is H, F, —CN, $C_{1-6}$ alkyl, or $C_{1-6}$ fluoroalkyl.

The unit of formula (VI) provides a polar group, which enhances etch resistance of the resin and photoresist composition and provides additional means to control the dissolution rate of the resin and photoresist composition. Monomers for forming the unit of formula (VI) include 3-hydroxy-1-adamantyl methacrylate (HAMA) and preferably 3-hydroxy-1-adamantyl acrylate (HADA).

The resin can include one or more additional units of general formulae (IV), (V) and/or (VI) different from the first units. Where additional such units are present in the resin, they will preferably include an additional leaving group-containing unit of formula (IV) and/or a lactone-containing unit of formula (V).

In addition to the polymerized units described above, the resin can include one or more additional units which are not of general formula (IV), (V) or (VI). For example, a particularly suitable lactone group-containing unit is of the following general formula (VII):

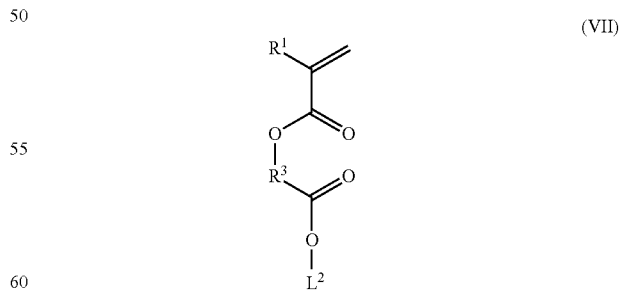

(VII)

wherein: $R^1$ is H, F, —CN, $C_{1-6}$ alkyl, or $C_{1-6}$ fluoroalkyl, heterocycloalkyl, $R^3$ is a $(C_1\text{-}C_3)$alkylene group and $L^2$ is a lactone group. The following exemplary monomers are suitable for use in forming the additional lactone unit of general formula (VII):

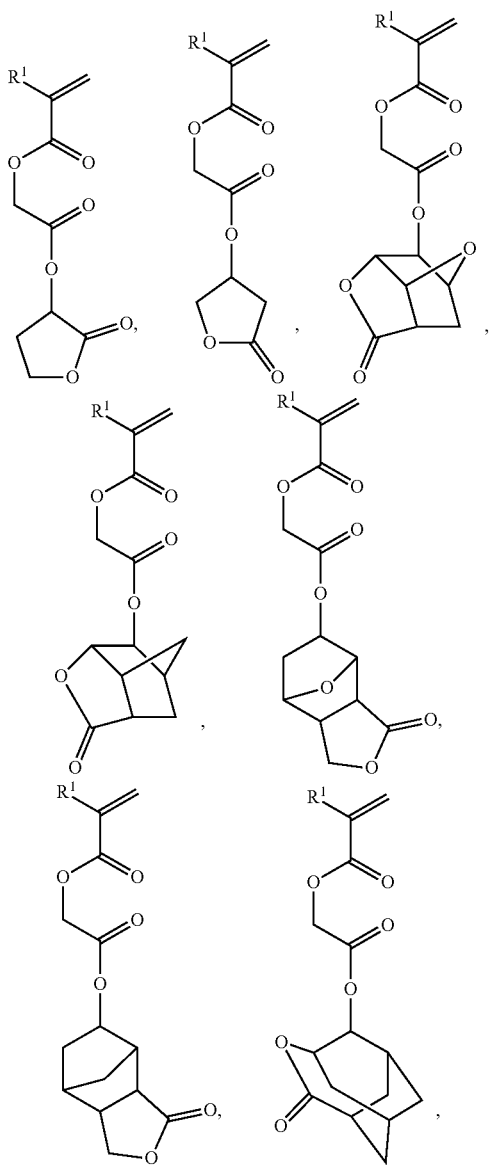

or a combination comprising at least one of the foregoing monomers, wherein $R^1$ is H, F, —CN, $C_{1-6}$ alkyl, or $C_{1-6}$ fluoroalkyl.

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Polymers for use in photoresists of the invention may suitably vary widely in molecular weight and polydisperity. Suitable polymers include those that have an $M_w$ of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)sulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 60° C. to 225° C. for about 0.5 to 5 minutes. We have found that coating layer of preferred antireflective compositions as disclosed herein may effectively undergo hardening at relatively lower temperatures such as 55° C. or 60° C.-75° C. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development (NTD) process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

As discussed, in certain aspects, a wet etch process may be suitably employed. Wet etching may be suitably carried out by exposing the surface to be etched (e.g. a metal nitride, or metal nitride coated with one or more organic and/or inorganic layers) with a wet etch composition for a time and temperature effective to etch the surface (e.g. metal nitride surface and/or coating layers thereon). Exemplary wet etching compositions include an aqueous mixture of ammonium hydroxide and a peroxide such as hydrogen peroxide, or a mixture of an acid such as sulfuric acid and a peroxide such as hydrogen peroxide. See US 2006/0226122 for exemplary compositions. The examples which follow also provide exemplary wet etch process conditions. As referred to herein, a "wet etch process" means treating substrate areas defined by a adjoining photoresist (after development of the photoresist image) with a fluid composition typically either acid or alkaline in combination with a peroxide agent, but in any event distinguished from a plasma dry etch.

The following non-limiting examples are illustrative of the invention.

Examples 1-4

Polymer Syntheses

Example 1

Polymer Synthesis

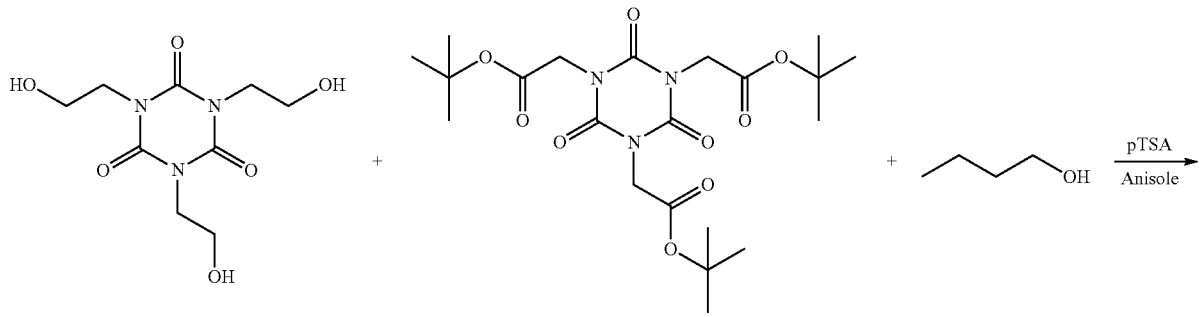

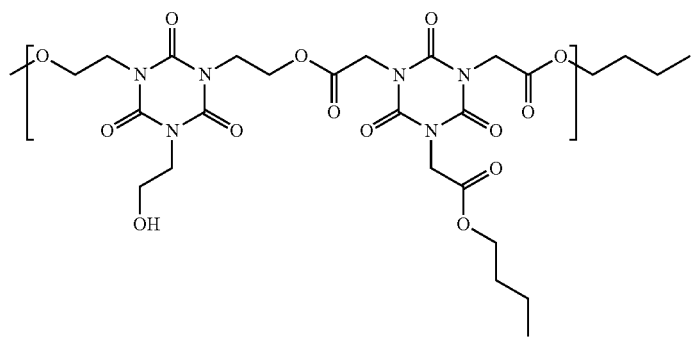

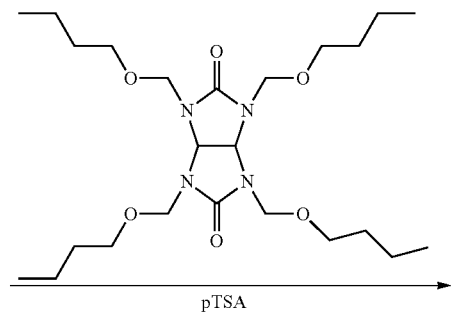

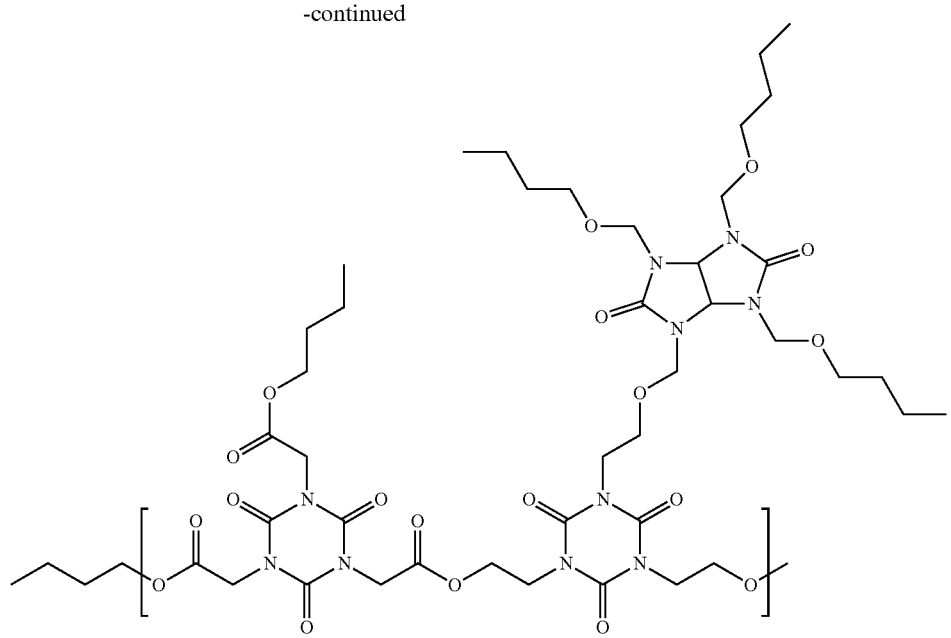

A 3-necked 100 ml round bottom flask was equipped with a thermocouple, Dean-Stark, condenser and a heating oil bath. Tris(2-hydroxyethyl) iso-cyanurate (17.83 g, 68.2 mmol), tri-test-butyl 2,2',2''-(2,4,6-trioxo-1,3,5-triazinane-1,3,5-triyl)triacetate (32.17 g, 68.2 mmol), n-Butanol (40.0 g, 540.0 mmol), p-Toulenesulfonic acid (0.39 g, 2.0 mmol) and 34 g of Anisole were weighed into a flask. It was heated up to a set temperature (105° C.) with stirring for 5 h and it was reheated up to a set temperature (150° C.) with stirring for 6.5 h. The solution was then cooled to room temperature. The crude reaction mixture was diluted with THF (70 g) for the isolation. Reaction mixture was precipitated with MTBE (700 g) and then filtrated and vacuum dried for 24 h at 40° C. A 3-necked 100 ml round bottom flask was equipped with a thermocouple, condenser and a heating oil bath. The prepolymer (20 g), p-Toulenesulfonic acid (0.15 g, 0.79 mmol), 1,3,4,6-tetrakis(butoxymethyl)tetrahydroimidazo[4,5-d]imidazole-2,5 (1H,3H)-dione (11.4 g, 23.4 mmol) and 80 g of 2-hydroxysiobutyric acid methyl ester (HBM) were weighed into a flask. It was heated up to a set temperature (50° C.) with stirring for 4 h. The solution was quenched with trimethylamine (TEA) (0.5 mL). And then cooled the solution to the room temperature. Reaction mixture was precipitated with isopropyl alcohol (IPA) (1000 g) and then filtrated and vacuum dried for 24 h at 40° C.

Example 2

Polymer Synthesis

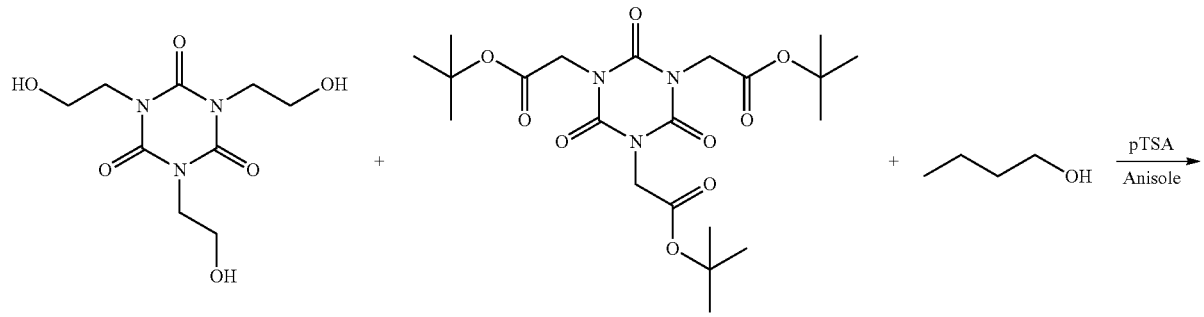

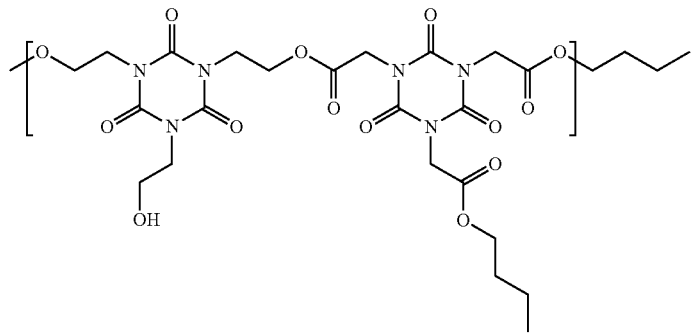
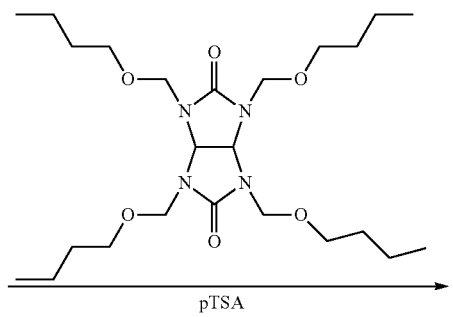

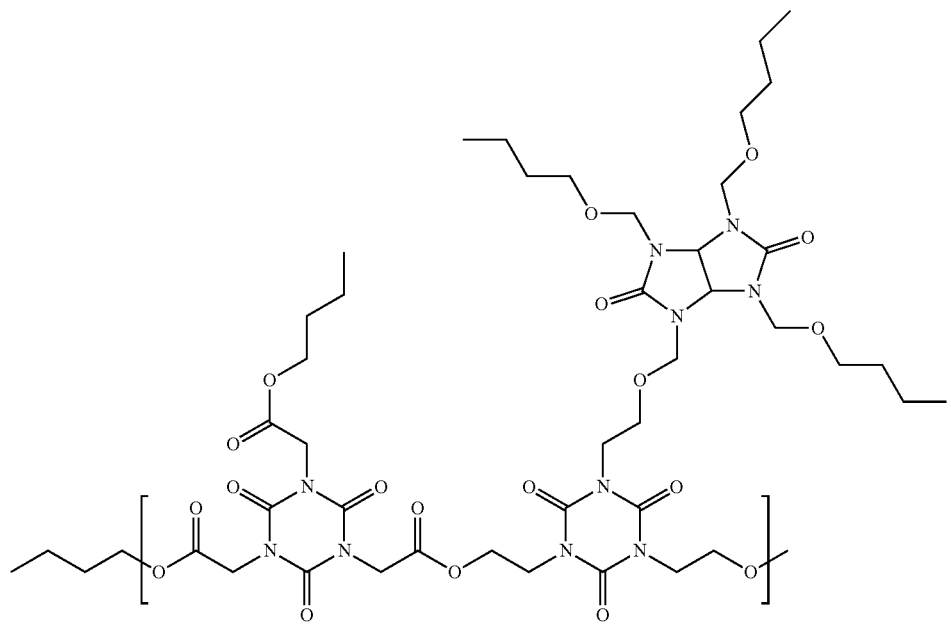

A 3-necked 100 ml round bottom flask was equipped with a thermocouple, Dean-Stark, condenser and a heating oil bath. Tris(2-hydroxyethyl) isocyanurate (25.91 g, 99.2 mmol), tri-tert-butyl 2,2',2''-(2,4,6-trioxo-1,3,5-triazinane-1,3,5-triyl)triacetate (24.09 g, 51.1 mmol), n-Butanol (40.0 g, 540.0 mmol), p-Toulenesulfonic acid (0.43 g, 2.2 mmol) and 34 g of anisole were weighed into a flask. It was heated up to a set temperature (105° C.) with stirring for 5 h and it was reheated up to a set temperature (150° C.) with stirring for 10 h. And then cooled the solution to the room temperature. Crude was diluted with THF (70 g) for the isolation. Reaction mixture was precipitated with methyl tert-butyl ester (MTBE) (700 g) and then filtrated and vacuum dried for 24 h at 40° C. A 3-necked 100 ml round bottom flask was equipped with a thermocouple, condenser and a heating oil bath. The pre-polymer (20 g), p-Toulenesulfonic acid (0.15 g, 0.79 mmol), 1,3,4,6-tetrakis(butoxymethyl)tetrahydro-imidazo[4,5-d]imidazole-2,5(1H,3H)-dione (11.4 g, 23.4 mmol) and 80 g of HBM were weighed into a flask. It was heated up to a set temperature (50° C.) with stirring for 4 h. The solution was quenched with TEA (0.5 mL). And then cooled the solution to the room temperature. Reaction mixture was precipitated with IPA (1000 g), filtrated and then vacuum dried for 24 h at 40° C.

Example 3
Polymer Synthesis
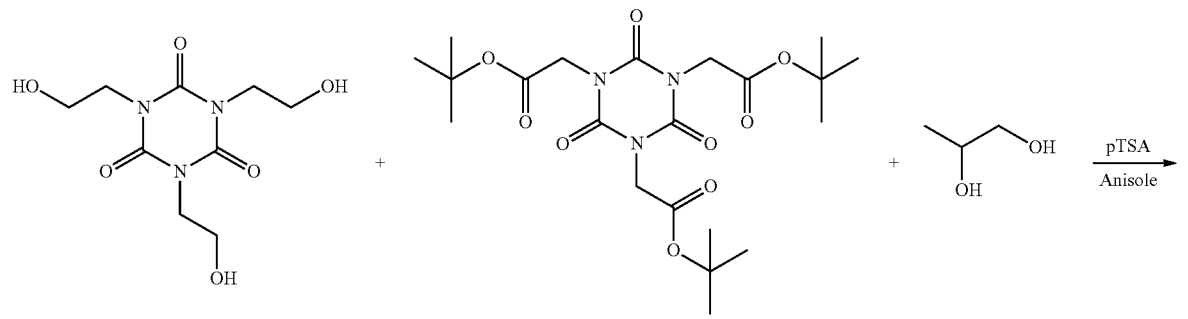
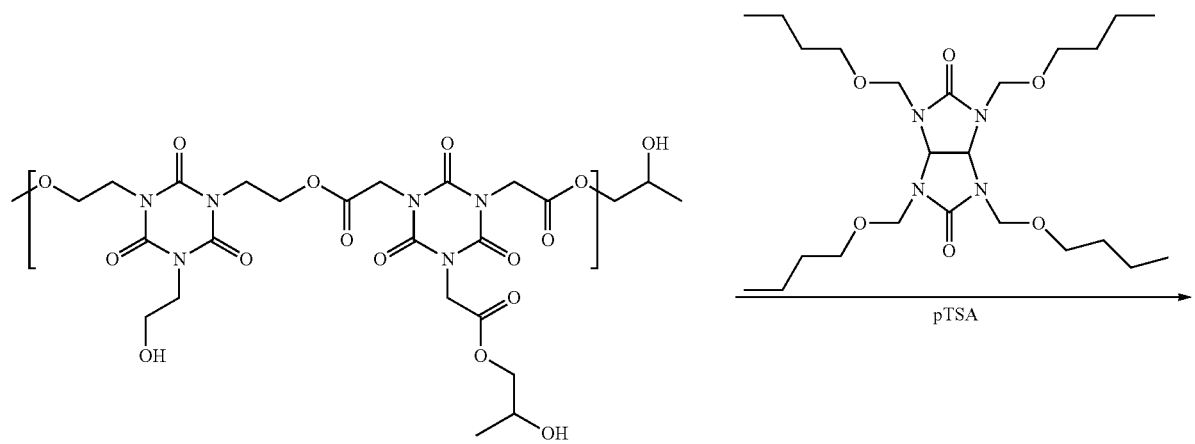
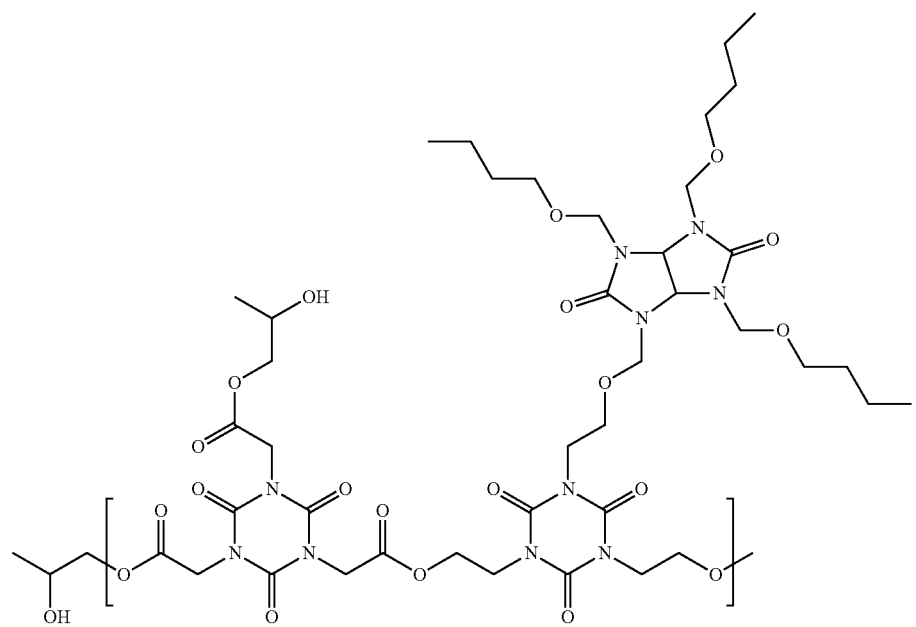

The 3-necked 100 ml round bottom flask was equipped with a thermocouple, Dean-Stark, condenser and a heating oil bath. Tris(2-hydroxyethyl) iso-cyanurate (14.76 g, 56.5 mmol), tri-tert-butyl 2,2′,2″-(2,4,6-trioxo-1,3,5-triazinane-1,3,5-triyl)triacetate (26.64 g, 56.5 mmol), 1,2-Propandiol (8.60 g, 113.0 mmol), p-Toulenesulfonic acid (0.43 g, 2.2 mmol) and 34 g of Anisole were weighed into a flask. It was heated up to a set temperature (150° C.) with stirring for 1 h. And then cooled the solution to room temperature. Crude was diluted with THF (80 g) for the isolation. Reaction mixture was precipitated with MTBE (800 g) and then filtrated and vacuum dried for 24 h at 40° C. A 3-necked 100 ml round bottom flask was equipped with a thermocouple, condenser and a heating oil bath. The prepolymer (20 g), p-Toulenesulfonic acid (0.15 g, 0.79 mmol), 1,3,4,6-tetrakis(butoxymethyl)tetrahydroimidazo[4,5-d]imidazole-2,5(1H, 3H)-dione (11.4 g, 23.4 mmol) and 80 g of HBM were weighed into a flask. It was heated up to a set temperature (50° C.) with stirring for 4 hrs. The solution was quenched with TEA (0.5 mL). And then cooled the solution to the room temperature. Reaction mixture was precipitated with IPA (1000 g) and then filtrated and vacuum dried for 24 h at 40° C.

Example 4

Polymer Synthesis

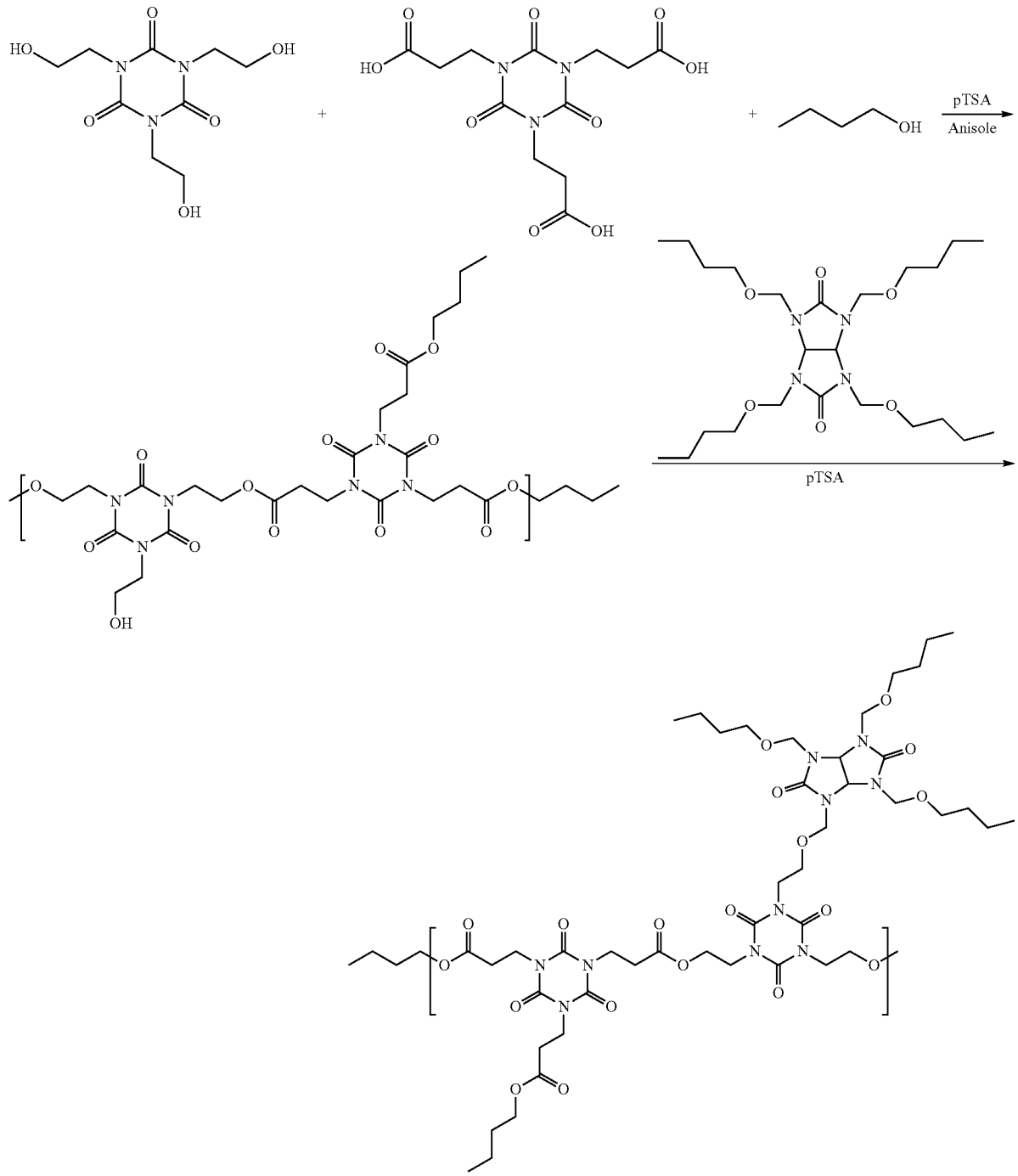

The 3-necked 100 ml round bottom flask was equipped with a thermocouple, Dean-Stark, condenser and a heating oil bath. Tris(2-hydroxyethyl) iso-cyanurate (30.43 g, 116.5 mmol), Tris(2-carboxyethyl) iso-cyanurate (20.11 g, 58.2 mmol), n-Butanol (20.0 g, 270.0 mmol), p-Toulenesulfonic acid (0.54 g, 2.8 mmol) and 34 g of Anisole were weighed into a flask. It was heated up to a set temperature (15° C.) with stirring for 3 h. The solution was then cooled to room temperature. Crude was diluted with HBM (160 g). A 3-necked 100 ml round bottom flask was equipped with a thermocouple, condenser and a heating oil bath. The pre-polymer solution (40 g), p-Toulenesulfonic acid (0.08 g, 0.42 mmol) and 1,3,4,6-tetrakis(butoxymethyl)tetrahydro-imidazo[4,5-d]imidazole-2,5(1H,3H)-dione (5.0 g, 10.3 mmol) were weighed into a flask. It was heated up to a set temperature (50° C.) with stirring for 4 h. The solution was quenched with TEA (0.5 mL). And then cooled the solution to the room temperature. Reaction mixture was precipitated with IPA (300 g) and Heptane (200 g) and then filtrated and vacuum dried for 24 h at 40° C.

Examples 5-8

Formulation of Coating Compositions

Example 5

0.947 g of the polymer produced in Example 1 above, and 0.013 g of 2,4,6-trimethylpyridinium p-toluenesulfonate salt were dissolved in 99.0 g of 2-hydroxysiobutyric acid methyl ester (HBM) solvent to provide the coating composition.

Example 6

0.947 g of the polymer produced in Example 2, and 0.013 g of 2,4,6-trimethylpyridinium p-toluenesulfonate salt were dissolved in 99.0 g of HBM solvent to provide the coating composition.

Example 7

0.947 g of the polymer produced in Example 3, and 0.013 g of 2,4,6-trimethylpyridinium p-toluenesulfonate salt were dissolved in 99.0 g of HBM solvent to provide the coating composition.

Example 8

Comparative Example 0.947 g of the polymer produced in Example 4, and 0.013 g of 2,4,6-trimethylpyridinium p-toluenesulfonate salt were dissolved in 99.0 g of HBM solvent to provide the composition.

Example 9

Evaluation Condition of Antireflective Compositions

The following Table 1 is an exemplary process condition utilized to evaluate present antireflective compositions.

TABLE 1

| Property evaluated | Instruments | Conditions |
| --- | --- | --- |
| Film thickness measurement | TEL Mark 8 track Opti-Probe Thermawave | 1500 rpm coating, baking at 205° C. for 60 sec and then thickness measurement. |
| Optical parameters | J. A. Woollam VUV-Vase | n/k@193 nm measured by ellipsometer around 600~800 Å film layer thickness. |
| Etch rate test | ICP Opti-Probe Thermawave | Exposed to the CF4/Ar = 4:3 mixed gas for 25 sec. around ~3000 Å film layer thickness. Measured thickness changing after the etch process by using Thermawave |

Examples 10-11

Lithographic Process and Performance Evaluation

Example 10

Lithographic Test Condition

The following Table 2 sets forth exemplary process and illumination condition for lithographic evaluation.

TABLE 2

| | Information |
|---|---|
| Illumination condition | NIKON 610C, 1.30NA, dipole 35, 0.98/0.78 s, 6% PSM mask |
| Process condition | Resist* (90 nm), SB: 110 C./50 s, PEB: 95 C./60 s BARC: Each BARC sample of above Examples 5-8 (22 nm), baking on 205° C./60 s Sublayer: Dow Chemical AR46 (65 nm), baking on 205° C./60 s |

*Resist was 193 nm chemically-amplified positive-acting formulation with methacrylate resin.

Example 11

Etch Rate and Lithographic Performance

Compositions of Examples 5-8 were spin coated onto semiconductor wafers as disclosed above. The compositions and polymers of the Examples 5-7 showed faster E/R performance in coordination with Ohnishi Parameter number and in particularly, Example 7 show fastest E/R with comparable EL/pattern collapse margin (PCM) and DoF margin by similar n/k to Example 8 (Comparative Example). The following Table 3 shows etch rate results by $CF_4$/Ar gas and Table 4 shows lithographic performance summary for the compositions of Examples 5-8 above.

TABLE 3

| | Ohnishi Parameter | Relative E/R (Å/s) |
|---|---|---|
| Example 5 | 7.0 | 1.02 |
| Example 6 | 7.2 | 1.09 |
| Example 7 | 7.5 | 1.25 |
| Example 8 (Comparative Example) | 6.5 | 1.00 |

TABLE 4

| | n/k@ 193 nm | EL margin [nm/% dose] | EoP [mJ/cm2] | PCM [nm] | FL margin [nm] |
|---|---|---|---|---|---|
| Example 5 | 1.94/0.24 | 0.63 | 42.0 | 40.62 | 285 |
| Example 6 | 1.96/0.27 | 0.61 | 42.5 | 39.81 | 300 |
| Example 7 | 1.95/0.24 | 0.61 | 42.1 | 41.79 | 270 |
| Example 8 (Comparative Example) | 1.96/0.28 | 0.61 | 42.4 | 41.34 | 270 |

What is claimed is:

1. A method for forming a photoresist relief image, comprising:
    a) applying on a substrate a layer of a coating composition comprising:
    a resin comprising repeat units that comprise a structure of following Formula(I):

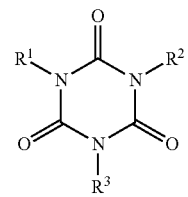

(I)

wherein:
    two of $R^1$, $R^2$ and $R^3$ are —(CXY)(C=O)O—R where R is linkage to another polymer unit and X and Y are each independently hydrogen or a non-hydrogen substituent, and
    one of $R^1$, $R^2$ and $R^3$ is 1) other than —$CH_2$(C=O)O—R and 2) comprises one or more oxygen atoms; and
    b) applying a layer of a photoresist composition above the coating composition layer.

2. The method of claim 1 the resin comprises a polymerized group obtainable from reaction of a monomer of the following Formula (II):

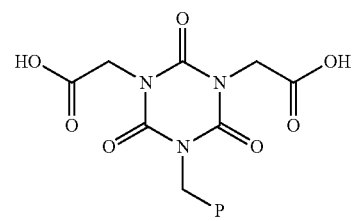

(II)

wherein in Formula (II) P is hydrogen or a non-hydrogen substituent.

3. The method of claim 1 wherein the resin further comprises crosslinker units.

4. The method of claim 1 wherein the resin comprises one or more of the following structures shown within the bracket:

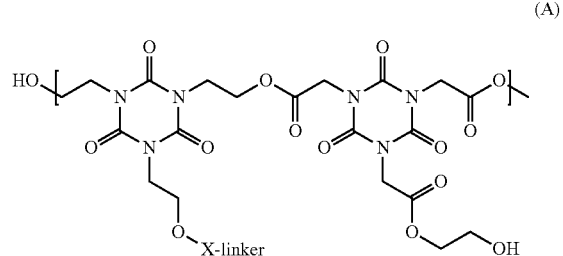

(A)

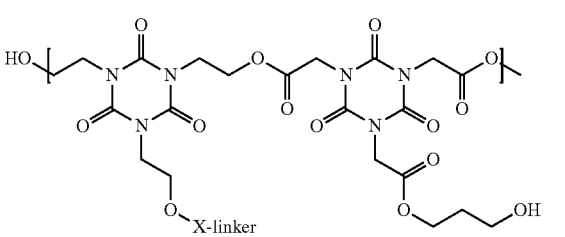

(B)

(C)
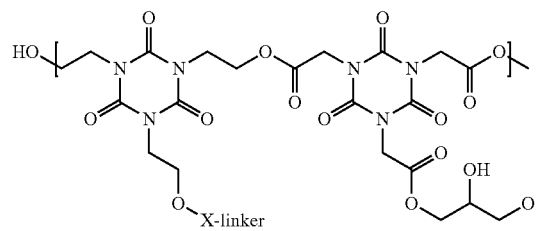
(D)
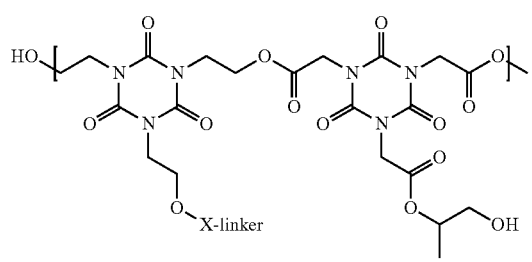
(E)
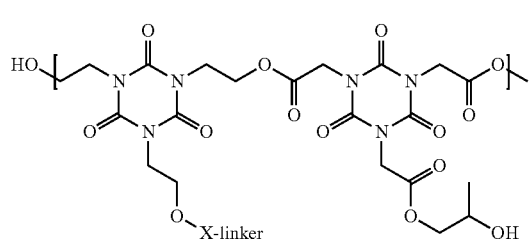
(F)
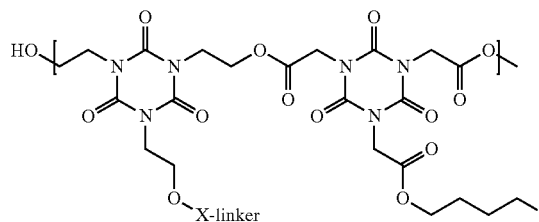
(G)
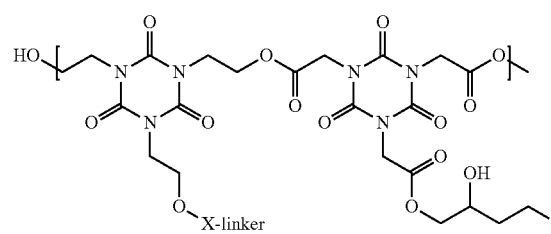
(H)
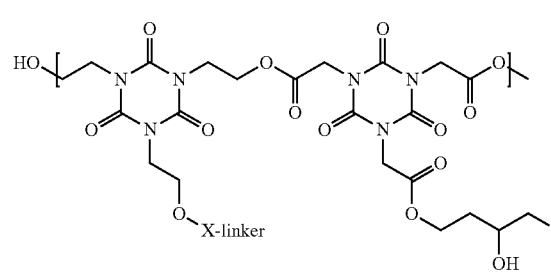
(I)
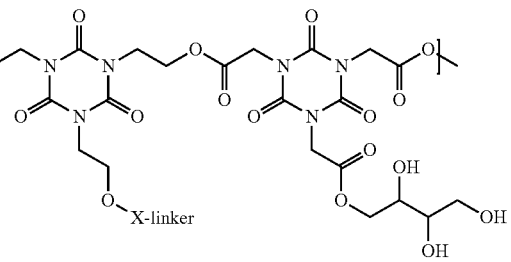
(J)
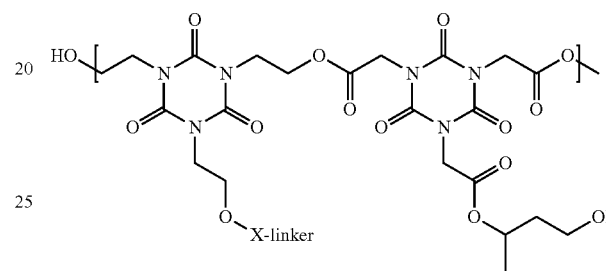
(K)
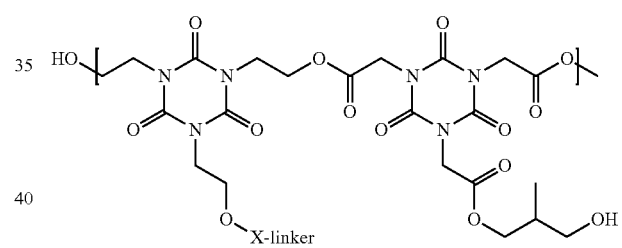
(L)
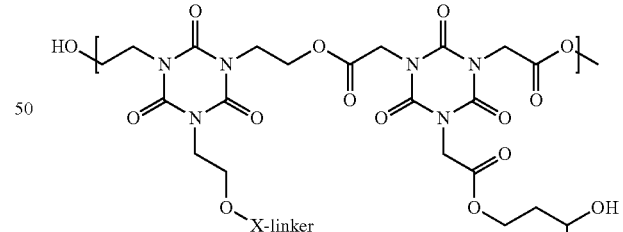
(M)
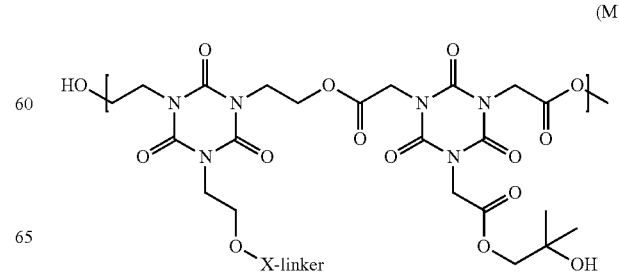

-continued

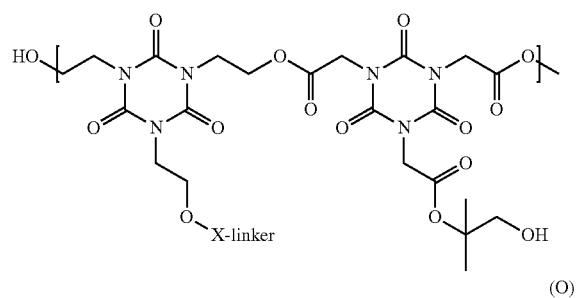
(N)

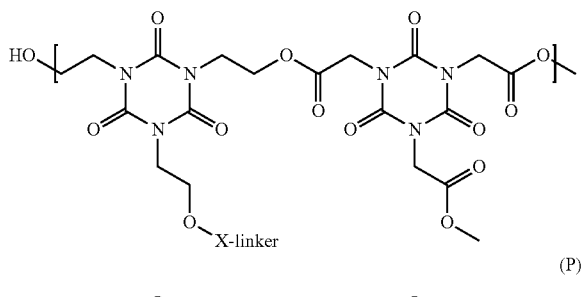
(O)

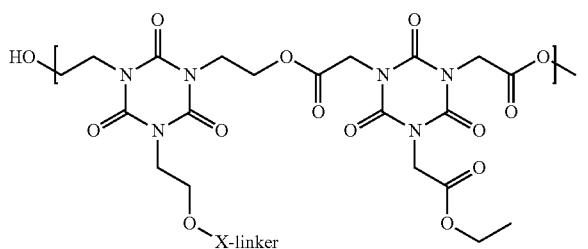
(P)

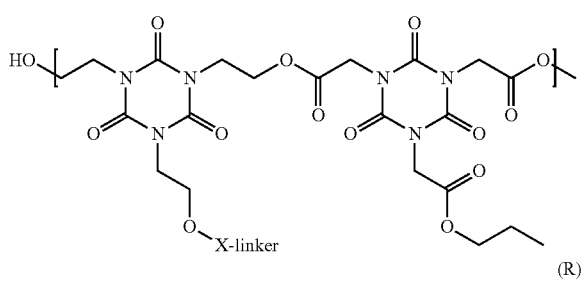
(Q)

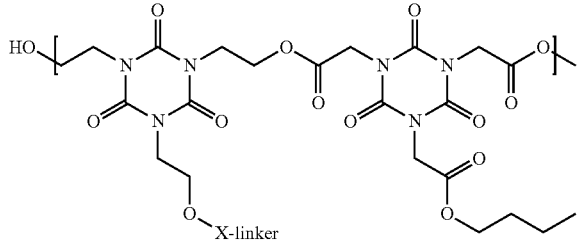
(R)

wherein in each structure X-linker is a non-hydrogen substituent.

5. The method of claim 4 wherein X-linker is a cross-linkable moiety.

6. The method of claim 1 wherein the resin has an Ohnishi parameter value of 7 or greater.

7. The method of claim 1 wherein the coating composition further comprises a crosslinker component that is distinct from the resin.

8. The method of claim 1 wherein the photoresist composition layer is imaged with activating radiation and the imaged photoresist composition layer is developed to provide a photoresist relief image.

9. The method of claim 1 wherein the coating composition layer is thermally treated before applying the photoresist composition layer.

10. A coated substrate, comprising:
a substrate having thereon:
a) a layer of a coating composition comprising:
1) a resin comprising repeat units that comprise a structure of following Formula(I):

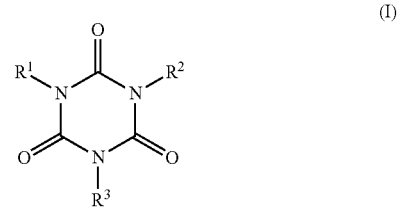
(I)

wherein:
two of $R^1$, $R^2$ and $R^3$ is —(CXY)(C=O)O—R where R is linkage to another polymer unit and X and Y are each independently hydrogen or a non-hydrogen substituent, and one of $R^1$, $R^2$ and $R^3$ is 1) other than —CH$_2$(C=O)O—R and 2) comprises one or more oxygen atoms; and 2) a substituted isocyanurate compound; and b) a layer of a photoresist composition above the coating composition layer.

11. The substrate of claim 10 wherein the resin comprises one or more of the following structures shown within the bracket:

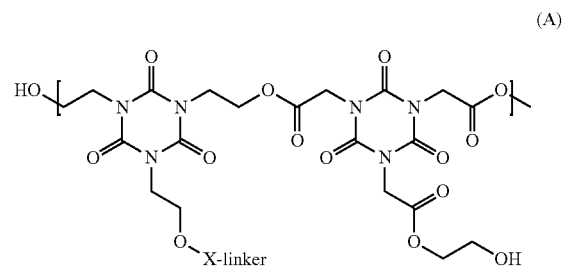
(A)

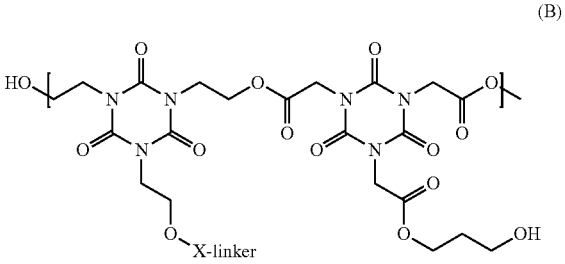
(B)

-continued (C)

(D)

(E)

(F)

(G)

(H)

(I)

(J)

(K)

(L)

(M)

-continued (N)
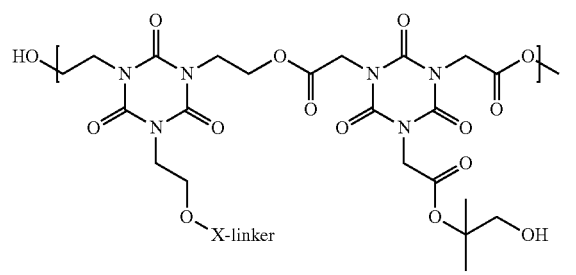

(O)
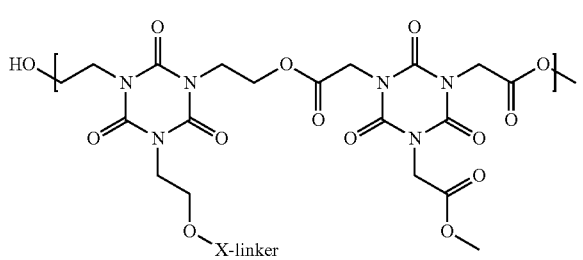

(P)
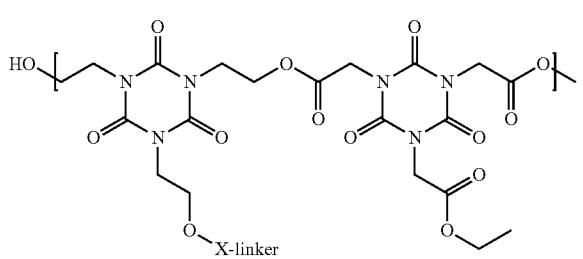

(Q)
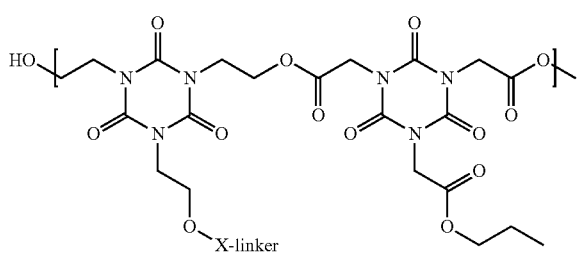

(R)
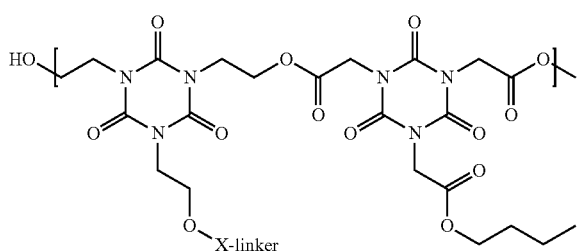

wherein in each structure X-linker is a non-hydrogen substituent.

12. The substrate of claim 11 wherein X-linker is a crosslinkable moiety.

13. The method of claim 1 wherein the resin comprises a structure as shown within the brackets of the following Formula (III):

(III)
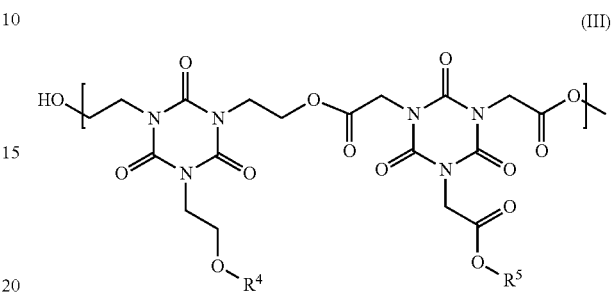

wherein Formula (III) $R^4$ is a group that can crosslink or form covalent bonds between resins; and $R^5$ is a hydrogen or non-hydrogen substituent.

14. The method of claim 13 wherein $R^5$ is non-hydrogen substituent.

15. The method of claim 14 wherein $R^4$ is a nitrogen-containing moiety.

16. The method of claim 13 wherein $R^4$ is a nitrogen-containing moiety.

17. The substrate of claim 10 wherein the resin comprises a structure as shown within the brackets of the following Formula (III):

(III)
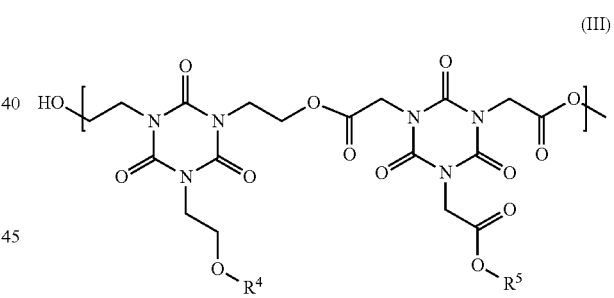

wherein in Formula (III), $R^4$ is a group that can crosslink or form covalent bonds between resins; and $R^5$ is a hydrogen or non-hydrogen substituent.

18. The substrate of claim 17 wherein $R^5$ is non-hydrogen substituent.

19. The substrate of claim 17 wherein $R^4$ is a nitrogen-containing moiety.

* * * * *